(12) United States Patent
Kiefer et al.

(10) Patent No.: US 10,571,223 B2
(45) Date of Patent: Feb. 25, 2020

(54) SYSTEM AND METHOD FOR DETECTING HIT LOCATIONS USING THE TIME DOMAIN

(71) Applicant: Invocon, Inc., Conroe, TX (US)

(72) Inventors: Karl F. Kiefer, Conroe, TX (US); Donald Chaffee, Crestview, FL (US); Douglas Heermann, Conroe, TX (US); Brian Philpot, Spring, TX (US)

( * ) Notice: Subject to any disclaimer, the term of this patent is extended or adjusted under 35 U.S.C. 154(b) by 168 days.

(21) Appl. No.: 15/911,052

(22) Filed: Mar. 2, 2018

(65) Prior Publication Data

US 2018/0252499 A1    Sep. 6, 2018

Related U.S. Application Data

(60) Provisional application No. 62/466,336, filed on Mar. 2, 2017.

(51) Int. Cl.
| | |
|---|---|
| *F41G 7/00* | (2006.01) |
| *H05K 1/14* | (2006.01) |
| *F41H 11/02* | (2006.01) |
| *F41J 9/08* | (2006.01) |
| *F41G 7/22* | (2006.01) |
| *H05K 1/03* | (2006.01) |

(52) U.S. Cl.
CPC ............. *F41G 7/001* (2013.01); *F41G 7/224* (2013.01); *F41H 11/02* (2013.01); *F41J 9/08* (2013.01); *H05K 1/144* (2013.01); *H05K 1/0393* (2013.01); *H05K 2201/041* (2013.01); *H05K 2201/10151* (2013.01)

(58) Field of Classification Search
CPC ....... H05K 1/144; H05K 1/0393; F41H 11/02
See application file for complete search history.

(56) References Cited

U.S. PATENT DOCUMENTS

| | | | |
|---|---|---|---|
| 8,307,694 B1 * | 11/2012 | Kiefer | ....................... G01S 5/06 73/12.01 |
| 8,316,690 B1 * | 11/2012 | Kiefer | ..................... G01M 7/00 73/12.01 |
| 2013/0099809 A1 * | 4/2013 | Wang | ................... G01R 35/005 324/750.02 |

* cited by examiner

*Primary Examiner* — Alvaro E Fortich
(74) *Attorney, Agent, or Firm* — Shannon L Warren

(57) ABSTRACT

A time domain detection system to measure and report on hypervelocity impacts HVI between an interceptor vehicle and a target vehicle. Wherein, said time domain detection system comprises a target vehicle components installed on said target vehicle, a one or more panels arranged on a portion of said target vehicle at a potential HVI locations, and a hit detection system wired into said one or more panels. Said target vehicle components comprise at least said hit detection system, and a lines. Said one or more panels are wired into said hit detection system with said lines. Said hit detection system is configured to communicate with said one or more panels over said lines. Said one or more panels can each comprise a one or more detector panel layers, and a two or more insulator layers.

15 Claims, 8 Drawing Sheets

SYSTEM AND METHOD FOR DETECTING HIT LOCATIONS USING THE TIME DOMAIN

CROSS-REFERENCE TO RELATED APPLICATIONS

This application claims benefit to U.S. Patent Application No. 62/466,336 filed on Mar. 2, 2017.

STATEMENT REGARDING FEDERALLY SPONSORED RESEARCH OR DEVELOPMENT (IF APPLICABLE)

Not applicable.

REFERENCE TO SEQUENCE LISTING, A TABLE, OR A COMPUTER PROGRAM LISTING COMPACT DISC APPENDIX (IF APPLICABLE)

Not applicable.

BACKGROUND OF THE INVENTION

Missile Defense for the US involves development of defensive weapons (missiles) that can be launched to intercept and destroy threat missiles launched by adversaries. In order to develop and test these defensive capabilities, MDA requires that target missiles be designed that faithfully represent known and expected threat vehicles.

A major challenge within the target missile community has always been to identify the exact location of first contact between a defensive missile and the target missile to which it is directed. The exact location is needed for two reasons:

(1) The defensive missile designers must know how well their guidance and control systems are working.

(2) Lethality assessment must show that the target has been completely neutralized.

Instrumentation systems integrated into target missiles have been designed to provide this information. Several technologies have been used to perform the location of the initial contact and transmit this information off the target to ground evaluation personnel—they include: (a) Grids of fiber optic materials organized into X Y grids so that any interruption of signals within the grid may be associated with two broken paths, (b) Grids of wire having signals present from one end to the other that are organized in grids to pin point initial contact by breaking the wires, (c) Make Screens that are layered conductive patches that are charged with electrical current. When a penetration of the screen occurs, the conductive layers are shorted and the voltage is dissipated. Although simple, the make screen is not an accurate locator of initial hit point since the entire screen is rendered inoperative with a single hit.

All three technologies and variants from different manufacturers become very difficult to use when targets begin to take on complex aerodynamic shapes. The problem is further complicated when the vehicle demonstrates the ability to maneuver and thus the defensive missile must be able to track any aspect ratio of the target and the initial hypervelocity impact ("HVI") may occur at any point on the target vehicle.

What is needed in many instances is a "gap filler" technology that could be used in concert with the primary lethality assessment technology.

None of the known inventions and patents, taken either singularly or in combination, is seen to describe the instant disclosure as claimed.

BRIEF SUMMARY OF THE INVENTION

A time domain detection system to measure and report on hypervelocity impacts HVI between an interceptor vehicle and a target vehicle. Wherein, said time domain detection system comprises a target vehicle components installed on said target vehicle, a one or more panels arranged on a portion of said target vehicle at a potential HVI locations, and a hit detection system wired into said one or more panels. Said target vehicle components comprise at least said hit detection system, and a lines. Said one or more panels are wired into said hit detection system with said lines. Said hit detection system is configured to communicate with said one or more panels over said lines. Said one or more panels can each comprise a one or more detector panel layers, and a two or more insulator layers. Said two or more insulator layers comprise at least a top insulator layer and a bottom insulator layer of said one or more panels. Said one or more detector panel layers comprise at least a first detector panel layer. Said two or more insulator layers comprise at least a first insulator layer and a second insulator layer. Said top insulator layer is arranged over said first detector panel layer. Layers of said one or more panels continue such that each said one or more detector panel layers comprises an insulator below and above itself. The last layer of said one or more panels comprises said bottom insulator layer. Each of said one or more detector panel layers comprise at least one of a circuit path. Each said circuit path comprise an injection point end and an open circuit end. Said injection point end are connected to said hit detection system with one of said lines. Said hit detection system is configured to send a pulse through said injection point end, said pulse is reflected from said open circuit end and back to said injection point end as a return signal. Said hit detection system is configured to measure a reflection time between said pulse and said return signal and determine if said circuit path is in a nominal or broken condition. Said hit detection system is configured to send a plurality of said pulse and receive a plurality of said return signal to increase accuracy of measurement and to return information on progressive damage. Said hit detection system is configured to calculate a missing signal where said return signal does not return to said injection point end.

BRIEF DESCRIPTION OF THE SEVERAL VIEWS OF THE DRAWING

FIG. 5 illustrates an elevated exploded view of first panel 212a.

FIG. 8 illustrates a perspective exploded front side view of first panel 212a.

DETAILED DESCRIPTION OF THE INVENTION

Figure 1:
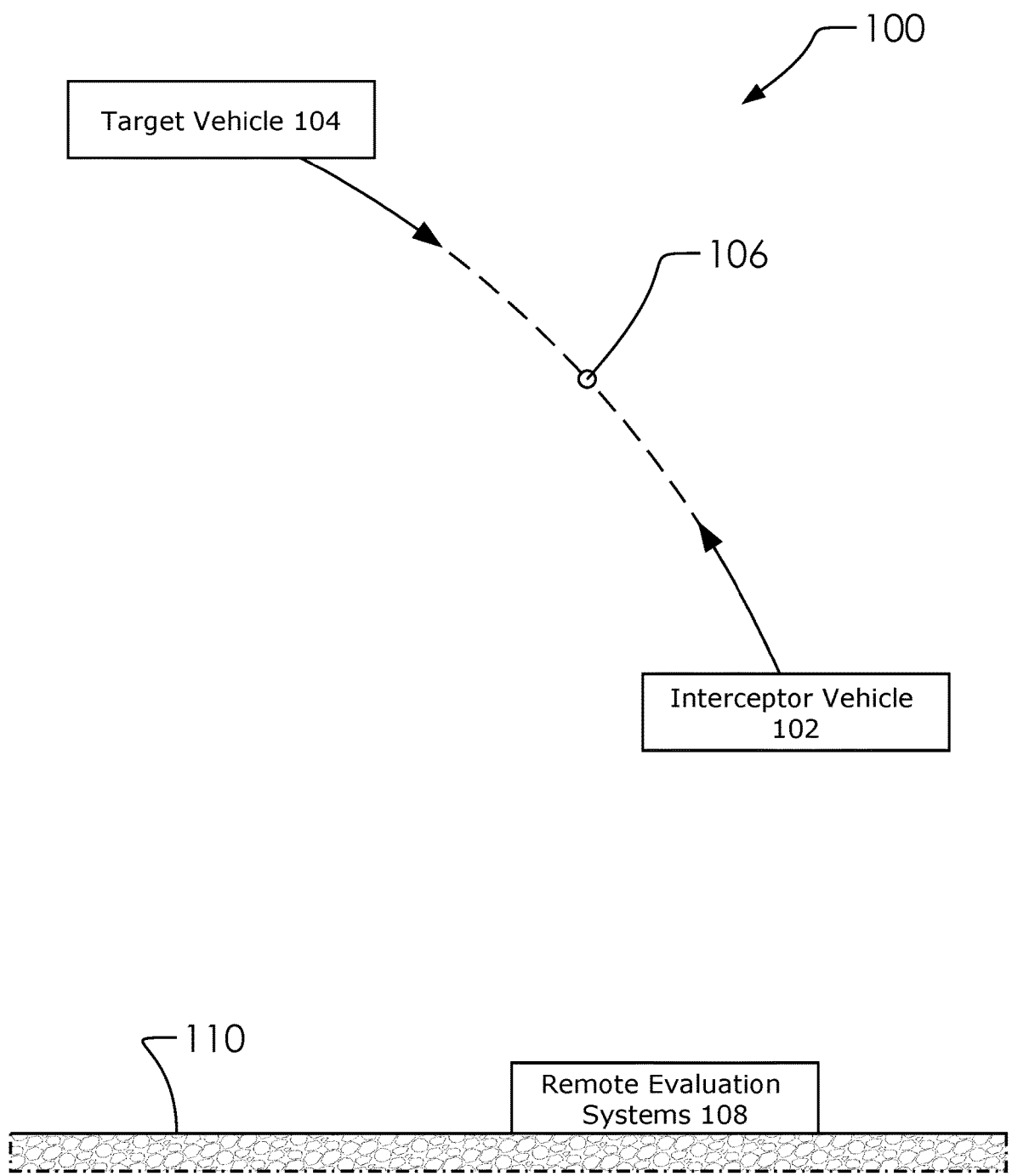
FIG. 1 illustrates a flight intercept scenario diagram of time domain detection system 100 with said target vehicle 104.

The following description is presented to enable any person skilled in the art to make and use the invention as claimed and is provided in the context of the particular examples discussed below, variations of which will be readily apparent to those skilled in the art. In the interest of clarity, not all features of an actual implementation are described in this specification. It will be appreciated that in the development of any such actual implementation (as in any development project), design decisions must be made to achieve the designers' specific goals (e.g., compliance with system- and business-related constraints), and that these goals will vary from one implementation to another. It will also be appreciated that such development effort might be complex and time-consuming, but would nevertheless be a routine undertaking for those of ordinary skill in the field of the appropriate art having the benefit of this disclosure. Accordingly, the claims appended hereto are not intended to be limited by the disclosed embodiments, but are to be accorded their widest scope consistent with the principles and features disclosed herein.

These parts are illustrated in the figures and discussed below:

a time domain detection system 100
an interceptor vehicle 102
a target vehicle 104
a first contact point 106
a ground evaluation systems 108
a ground 110
a target vehicle components 200
a guidance system 202
a control system 204
an instrumentation system 206
a hit detection system 208
a communications system 210
a one or more panels 212
a first panel 212a
a second panel 212b
a lines 214
a first line 214a
a second line 214b
a third line 214c
a one or more stages 302
a first stage 302a
a second stage 302b
a target payload 304
a potential HVI locations 404
a first potential HVI location 404a
a second potential HVI location 404b
a flexible circuit card material 406
a circuit path 408
an exterior surface 410
a top insulator layer 502
a one or more detector panel layers 504
a first detector panel layer 504a
a second detector panel layer 504b
a detector layer n 504n
a two or more insulator layers 506
a first insulator layer 506a
a second insulator layer 506b
an insulator layer n 506n
an open circuit end 508
an injection point end 510
a first trace 512a
a second trace 512b
a third trace 512c
a ground traces 514
a bottom insulator layer 516
a high frequency pulse illustration 600
a starting point 602
an open circuit reflection point 604
a pulse 606
a tuned conductive path 608
a reflected signal 610
a time domain signal graph 612
a reflection time 614
a missing signal 616
a method of using a time domain detection system 700
a first step 702a
a second step 702b
a third step 702c
a fourth step 702d
a bottom surface 800
a top surface 802

FIG. 1 illustrates a flight intercept scenario diagram of time domain detection system 100 with said target vehicle 104.

In one embodiment, said time domain detection system 100 can comprise one or more components on said target vehicle 104 being configured to measure and report on hypervelocity impacts (HVI) with said interceptor vehicle 102; specifically, the location on said target vehicle 104 of an impact between said interceptor vehicle 102 and said target vehicle 104.

One goal of said time domain detection system 100 is to identify the impact location on said target vehicle 104 and time of said HVI with said interceptor vehicle 102 in order to improve guidance and control systems and to assess whether said target vehicle 104 has been neutralized. In one embodiment, said target vehicle 104 can communicate with said remote evaluation systems 108 regarding the HVI. Another goal of said time domain detection system 100 can comprise enabling a very quick collection of data from said target vehicle 104.

For example, in one embodiment, said time domain detection system 100 must collect data, encode and transmit within a 40 microsecond window of time. In one embodiment, said ground 110 can be on land, or sea. In another embodiment, said remote evaluation systems 108 can be in the air.

Figure 2:
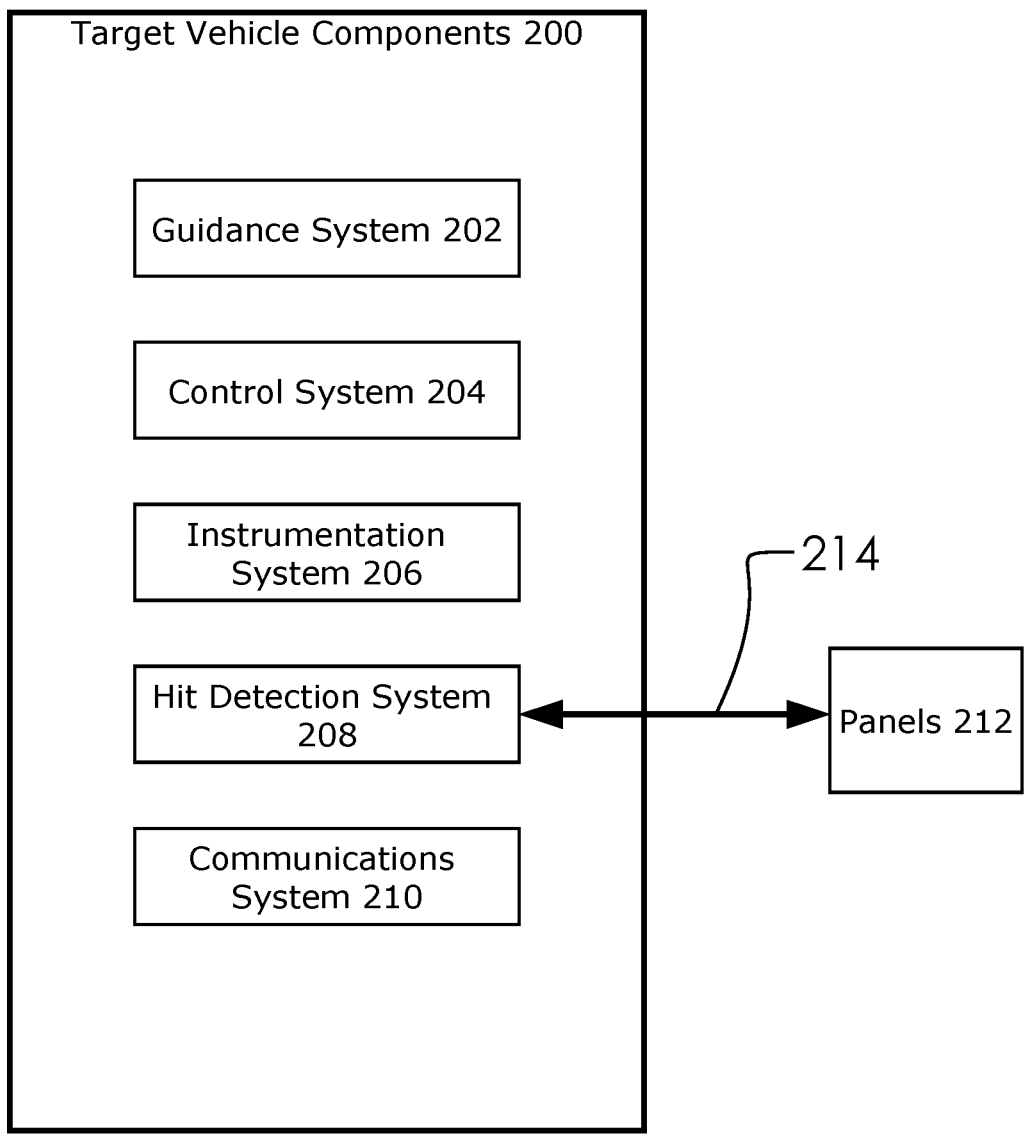
FIG. 2 illustrates said target vehicle components 200 as a block diagram.

FIG. 2 illustrates said target vehicle components 200 as a block diagram.

In one embodiment, said target vehicle components 200 can comprise said guidance system 202, said control system 204, said instrumentation system 206, said hit detection system 208 and said communications system 210.

In one embodiment, said one or more panels 212 can comprise said first panel 212a and said second panel 212b.

In one embodiment, said lines 214 can comprise said first line 214a, said second line 214b and said third line 214c.

In one embodiment, said time domain detection system 100 can comprise said communications system 210, said one or more panels 212, said second panel 212b and said lines 214.

Said target vehicle 104 can comprise a plurality of components and sensors for measuring and reporting events and conditions of said target vehicle 104.

In one embodiment, said hit detection system 208 can comprise an FPGA configured to communicate with said one or more panels 212 and said communications system 210. In one embodiment, said communications system 210 can be configured to transmit a status report from said hit detection system 208. In one embodiment, said hit detection system 208 can communicate with said one or more panels 212 over said lines 214.

In one embodiment, said communications system 210 can be destroyed with said target vehicle 104 and said interceptor vehicle 102 within 40 ms of contact. Accordingly, said time domain detection system 100 must detect, encode and broadcast a status of said target vehicle 104 in a short period of time such as 40 microseconds (as noted herein). In one embodiment, said time domain detection system 100 can function without guidance system 202, control system 204 and/or instrumentation system 206 (although target vehicle 104 might be compromised). Said time domain detection system 100 can comprise a system for monitoring a vehicle of different types regardless of whether the other components among said target vehicle components 200 are in use.

Figure 3:
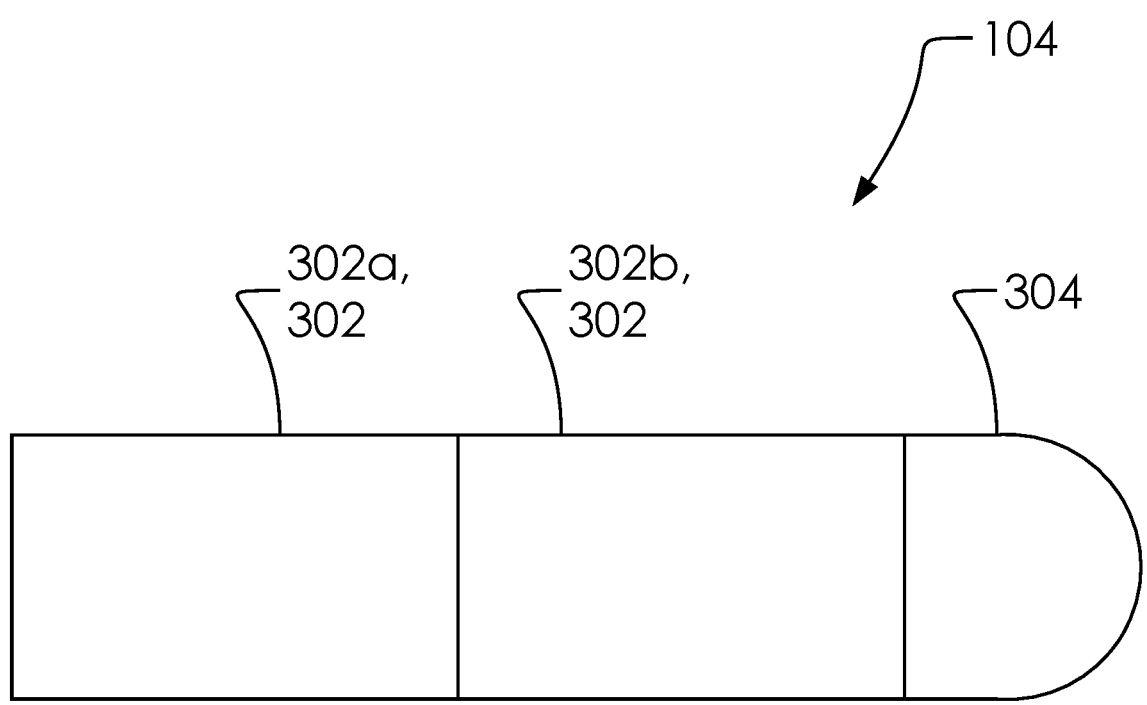
FIG. 3 illustrates an elevated notional front side view of target vehicle 104.

FIG. 3 illustrates an elevated notional front side view of target vehicle 104.

In one embodiment, said one or more stages 302 can comprise said first stage 302a and said second stage 302b.

In one embodiment, said target vehicle 104 can comprise said one or more stages 302 and said target payload 304.

As is known in the art, destroying said target payload 304 is a desired result of deploying said target vehicle 104. Said time domain detection system 100 can measure one or more signals to determine the success of said interceptor vehicle 102 in destroying said target payload 304.

In one embodiment, said target vehicle 104 can comprise a non-military vehicle, although, as discussed herein military applications are enabled. One example of said time domain detection system 100 in use for non-military vehicles can comprise spacecraft.

Figure 4A:
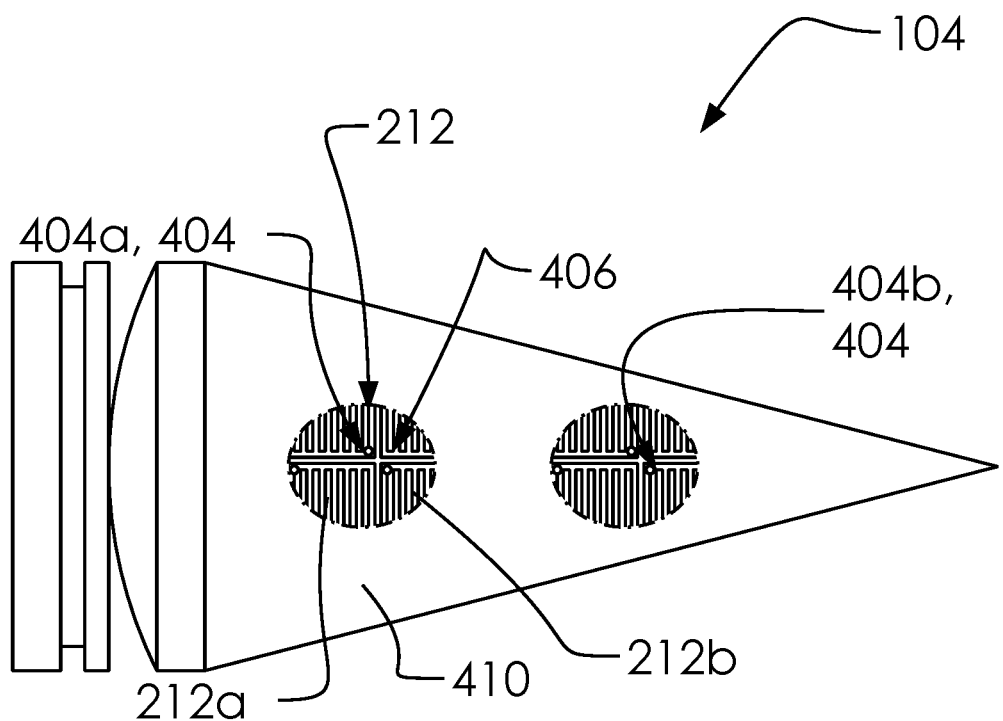
FIG. 4A illustrates an elevated front side view of said target vehicle 104 with said flexible circuit card material 406, with cutaways of said one or more panels 212.

FIG. 4A illustrates an elevated front side view of said target vehicle 104 with said flexible circuit card material 406, with cutaways of said one or more panels 212.

Figure 4B:
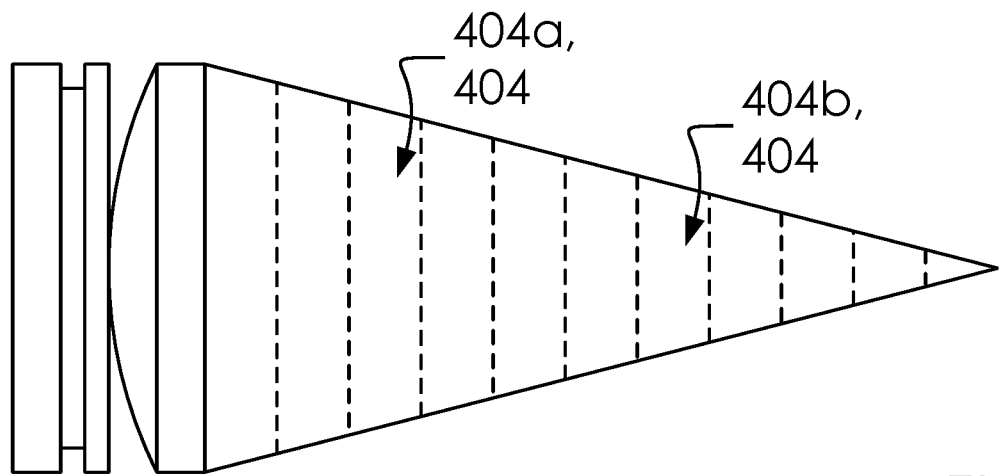
FIG. 4B illustrates an elevated front side view of target vehicle 104 with said potential HVI locations 404 being pointed out.

FIG. 4B illustrates an elevated front side view of target vehicle 104 with said potential HVI locations 404 being pointed out.

In one embodiment, said potential HVI locations 404 can comprise said first potential HVI location 404a and said second potential HVI location 404b.

In one embodiment, said flexible circuit card material 406 can comprise said circuit path 408.

In one embodiment, said target vehicle 104 can comprise said exterior surface 410.

In one embodiment, said time domain detection system 100 can comprise said potential HVI locations 404.

In one embodiment, said target vehicle 104 can comprise said potential HVI locations 404 being areas where said time domain detection system 100 will not interfere with other structural parts of said target vehicle 104 and/or places of interest. As illustrated in FIG. 4B, said potential HVI locations 404 can be arranged in layers or patterns along said exterior surface 410 of said target vehicle 104. Said time domain detection system 100 can be applied in various manners.

In one embodiment, said target vehicle 104 can comprise a cone shape such that said one or more panels 212 may not work unless they are flexible. In one embodiment, said one or more panels 212 can comprise said flexible circuit card material 406 in order to conform to said target vehicle 104.

In one embodiment, said flexible circuit card material 406 can comprise aluminum.

Said time domain detection system 100 can be used for primary hit detection where said potential HVI locations 404 are substantially all parts of said target vehicle 104, not just difficult sensory areas. Said time domain detection system 100 could be used with spacecraft vehicles where detection, location, and evaluation of HVI events is desired.

As illustrated, said one or more panels 212 can be used to provide coverage. Illustrated on FIG. 4A is a cut away of the top layer of said one or more panels 212 to show underlying components as described below.

In another embodiment, said one or more panels 212 can be flat and inflexible circuits and remain functional, suited to flatter portions of said exterior surface 410.

Figure 5:
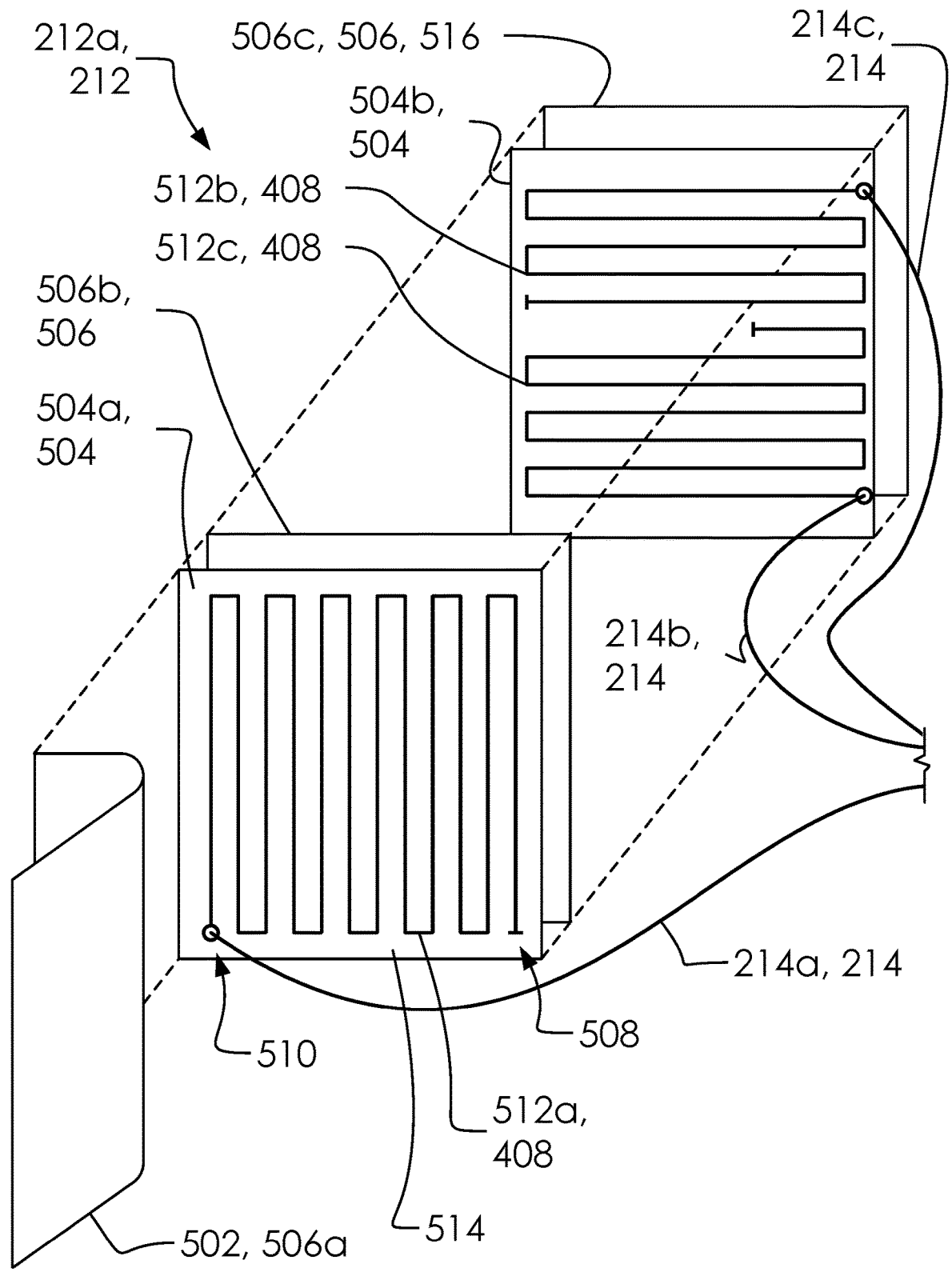

FIG. 5 illustrates an elevated exploded view of first panel 212a.

In one embodiment, said one or more detector panel layers 504 can comprise said first detector panel layer 504a, said second detector panel layer 504b and said ground traces 514.

In one embodiment, said first detector panel layer 504a can comprise said first trace 512a.

In one embodiment, said second detector panel layer 504b can comprise said second trace 512b and said third trace 512c.

In one embodiment, said two or more insulator layers 506 can comprise said detector layer n 504n, said first insulator layer 506a, said second insulator layer 506b, said insulator layer n 506n and said bottom insulator layer 516.

In one embodiment, said circuit path 408 can comprise said open circuit end 508, said injection point end 510 and said injection point end 510.

In one embodiment, said one or more panels 212 can comprise said top insulator layer 502, said one or more detector panel layers 504, said second detector panel layer 504b and said two or more insulator layers 506.

In one embodiment, said ground traces 514 can comprise ground paths deposited on either side of the path as well as on cover layers on the top and bottom that serve to tune the path to a specific impedance that matches the output impedance of the pulse electronics.

The patterns of the conductive paths of said circuit path 408 can be any pattern needed to cover specific areas where legacy hit detection techniques are not feasible due to shapes, sizes, or installation limitations.

The simple example would be a signal path laid in a spiral or a series of 180 degree reversals in the pattern that would result in a pattern of parallel paths, the distance between which would determine the baseline resolution of the impact location. This layout could be enhanced with a similar layout pattern superimposed at right angles to the first and driven by a redundant set of electronics. Other enhancements could be different patterns designed specifically cover a difficult area.

Said ground traces 514 on said one or more detector panel layers 504 can serve to block spurious radio frequency emissions that would not be acceptable to the radio frequency interference test criteria of Mil Standard 461.

In one embodiment, said circuit path 408 can be routed back and forth across portions of said one or more detector panel layers 504 in order to increase a transmission time from said injection point end 510 to said open circuit end 508 and back. Additionally, a plurality of said circuit path 408 can be included on a single layer of said one or more detector panel layers 504 (as illustrated with said second detector panel layer 504b comprising second trace 512b and third trace 512c). Accordingly, a strike in said second detector panel layer 504b can leave said second trace 512b active and said third trace 512c inactive, which would allow said time domain detection system 100 to calculate a location of a strike.

Said lines 214 can comprise one line to each of said injection point end 510 for said one or more detector panel layers 504.

In one embodiment, said one or more panels 212 can each comprise said one or more detector panel layers 504, said top insulator layer 502 and said two or more insulator layers 506; wherein, said top insulator layer 502 is arranged over said first detector panel layer 504a and said first insulator layer 506a is below said first detector panel layer 504a, and layers continue such that each one or more detector panel layers 504 comprises an insulator below and above itself. As illustrated, said bottom insulator layer 516 is said second insulator layer 506b (although, said bottom insulator layer 516 would be the bottom most layer in another embodiment.

Figure 6A:
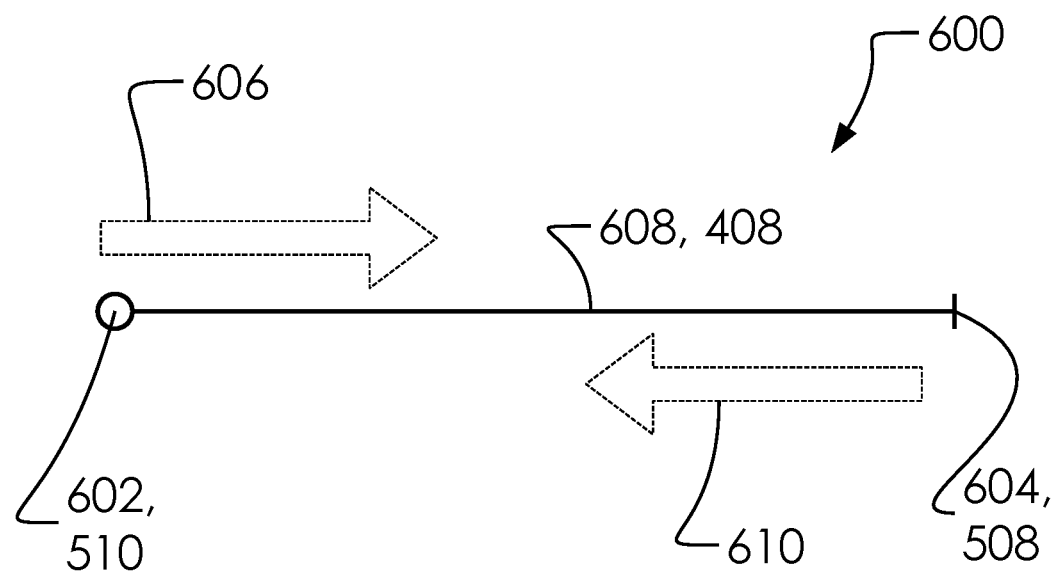
FIG. 6A illustrates said high frequency pulse illustration 600.

FIG. 6A illustrates said high frequency pulse illustration 600.

Figure 6B:
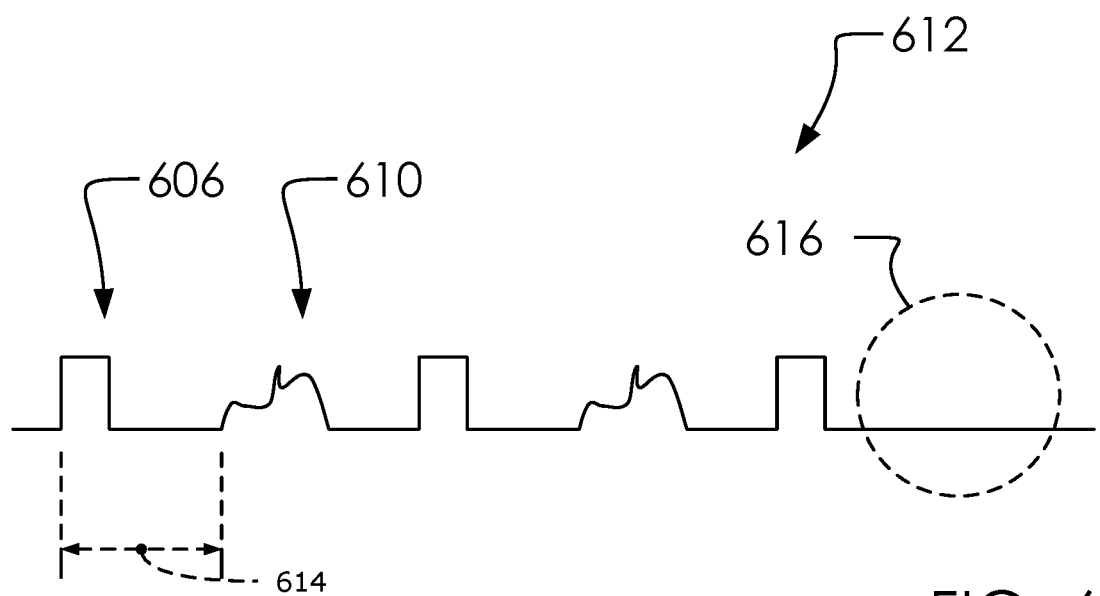
FIG. 6B illustrates said time domain signal graph 612.

FIG. 6B illustrates said time domain signal graph 612.

In one embodiment, said high frequency pulse illustration 600 can comprise said starting point 602, said open circuit reflection point 604, said pulse 606, said tuned conductive path 608, said reflected signal 610, said time domain signal graph 612, said reflection time 614 and said missing signal 616.

In one embodiment, said target vehicle 104 can comprise said tuned conductive path 608.

The electrical physics on which the system is based is the performance of said pulse 606 of current in a said tuned conductive path 608.

Said pulse 606 can comprise a tuned high frequency pulse.

Said pulse 606 can be fed into the conductive path at said starting point 602 of said tuned conductive path 608 and proceeds down the path at the speed of light minus the reactance effects of the wire. This reactance is controlled by the tuning design on said flexible circuit card material 406 (the flex card layout) and/or said circuit path 408 (the inherent reactance of the coaxial wire path).

Said tuned conductive path 608 is "open circuit" on the opposite end from the injection point (said open circuit reflection point 604). When said pulse 606 reaches this open circuit condition, the energy of said pulse 606 is reflected back in the opposite direction from whence it came. The elapsed time from the injection of the pulse and the return of the pulse to said starting point 602 can be used to compute the distance traveled in the wire.

Prior to the exposure of said tuned conductive path 608 to a HVI, the time of travel remains constant. When the signal path is interrupted by an HVI event, the path is shortened and the time of signal travel is reduced. The elapsed new time of signal travel can now be used to compute the exact distance from the injection point to the interruption in the path due to the HVI. The "map" of the signal path is known relative to the target in which it is installed and thus the location of the HVI event on the target can be calculated.

The ultimate accuracy of the system depends on three critical areas of high frequency electrical design. Those three critical areas are described below.

First, square wave pulses placed into a reactive circuit (in this case a wire path) contain wide band frequency energy that will result in a wide band return pulse. The bandwidth spreads the energy over time and thus reduces the consistency of the return signal and reduces the timing accuracy of the detector. Thus, the electronics that drives the system must be capable of creating a wave form that matches the reactance of the signal path. This pulse will travel down and back to the injection point with a minimum of time and frequency distortion.

Second, the electronics must be able to measure time to sub-nanosecond levels. The reason for this is the required spatial resolution of the system. The pulse travels the signal path at about a foot per nanosecond. To provide the needed system resolution, measurements of time must be at sub-nanosecond increments. To achieve this resolution, the electronics must be able to run clocks at 6 to 10 GHz speeds and be able to extract values from these clocks for transmission off the vehicle prior to the destruction of the system by the HVI event.

Third, the electronics must be capable of repeating pulses into the signal path as quickly as possible. This repeat time is limited by the impulse response of the signal path. It is desirable to damp the return pulse as quickly as possible so that another pulse may be injected into the path without inter-symbol interference. Further, the pulse repetition rate ("PRR") is limited by the time of travel. As the path becomes shorter due to the HVI damage, the PRR must be adjusted to the latest travel time. This adjustment must be made by the logic circuitry.

The system electronics transceiver (transmitter/receiver) consists of a pulse generator capable of injection the appropriate pulse shape into the signal path and a pulse detector/receiver that is synchronized with high speed clocks that are capable of measuring the time between the injection of the pulse and the arrival of the resulting reflection. The transfer time is calibrated and thus the travel speed is known. This speed and the travel time will compute the distance to the end of the signal path with current resolutions of 2 inches. Since the ultimate spatial resolution depends upon the speed of the counters, faster circuits will result in higher system resolution.

The implementation of the system electronics of the present invention has been realized by the use of devices from a non-analogous art, namely integrated circuits that were designed especially for supporting cell tower communications in telecommunications. The telecommunication application requires logical switching of signals and the ultimate multiplexing of Gigabits of information in serial transmission via fiber optic links on fixed, land based stations. These commercial products are programmable gate arrays that are "programmed" with appropriate logic to support cell operations. The input/output ports on these circuits are supported by extremely high speed logic designed to output the high data rates needed to support optical communications paths. The unique contribution of the present invention to the art of HVI impact detection system is to define means by which the high speed I/O on the communications circuits could be programmed into high speed clocks that could perform the time measurements needed to support signal path transit. This has successfully been accomplished and can resolve time at 6.5 GHz. Newer communications circuits are now available that are switching at 10 GHz with promises in the industry of 20 GHz in the near future. Thus, the design of the HVI for targeting applications can continue to increase resolution via use of commercially available programmable hardware. The advantages of this technique against existing grids and acoustic wave measurements include:

(1) the conductive path is singular and can be wound about in hard to instrument areas on a vehicle;

(2) Known locations (map) of the conductive path will identify the location of any interruption on the vehicle;

(3) The conductive path may be fabricated from wire, or printed on flexible circuit card material and thus bonded into the vehicle with a minimum of installation complexity; and (4) As the initial impact breach is enlarged by the incoming interceptor vehicle, the signal path could become shorter and shorter and thus specify times of travel that would relate to damage progression on the target.

In one embodiment, said hit detection system can be configured for sending a plurality of pulses in series through said injection point end, each of said plurality of pulses are reflected from said open circuit end and back to said injection point end as a return signal, measuring a reflection time between each of said pulse and said return signal, calculating whether each of said reflection times either remain constant, decrease or comprise a missing signal, calculating whether said circuit path is in said nominal condition or a broken condition where said reflection time decreases between pulses or said return signal does not return, continuing to measure for further changes in said reflection time after said broken condition is calculated to increase accuracy of measurement and to return information on progressive damage, calculating a current distance between said injection point and said open circuit for each of said plurality of pulses, and calculating a location of said hypervelocity impacts using said calculation of said current distance between said injection point and said open circuit.

Figure 7:
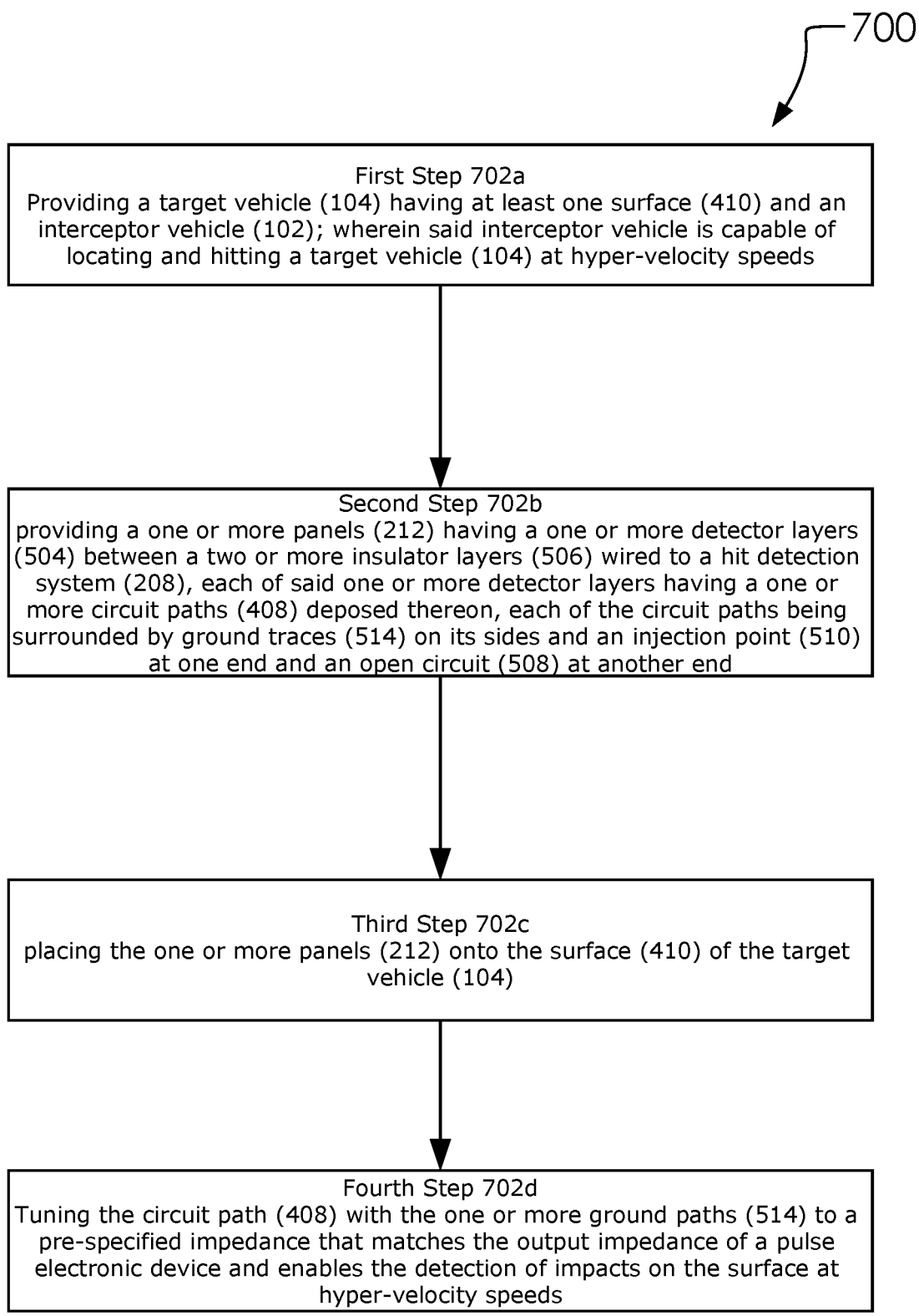
FIG. 7 illustrates said method of using a time domain detection system 700.

FIG. 7 illustrates said method of using a time domain detection system 700.

In one embodiment, said time domain detection system 100 can comprise said method of using a time domain detection system 700 and said method of using a time domain detection system 700.

In one embodiment, said method of using a time domain detection system 700 can comprise said a plurality of steps: said first step 702a can comprise providing said target vehicle 104 having said exterior surface 410; wherein, said interceptor vehicle 102 can be capable of locating and hitting said target vehicle 104 at hyper-velocity speeds. Said second step 702b can comprise providing said one or more panels 212 having said one or more detector panel layers 504 between said two or more insulator layers 506 being wired to said hit detection system 208; wherein, each of said one or more detector panel layers 504 have said circuit path 408 being deposed thereon; further wherein, each among said circuit path 408 comprise said ground traces 514 between said circuit path 408 and said open circuit end 508 at one end and said injection point end 510 at another end. Said third step 702c can comprise placing said one or more panels 212 onto said exterior surface 410 of said target vehicle 104. Said fourth step 702d can comprise tuning said circuit path 408 with said ground traces 514 to a pre-specified impedance that matches the output impedance of a pulse electronic device and enables the detection of impacts on said exterior surface 410 at hyper-velocity speeds.

Figure 8:
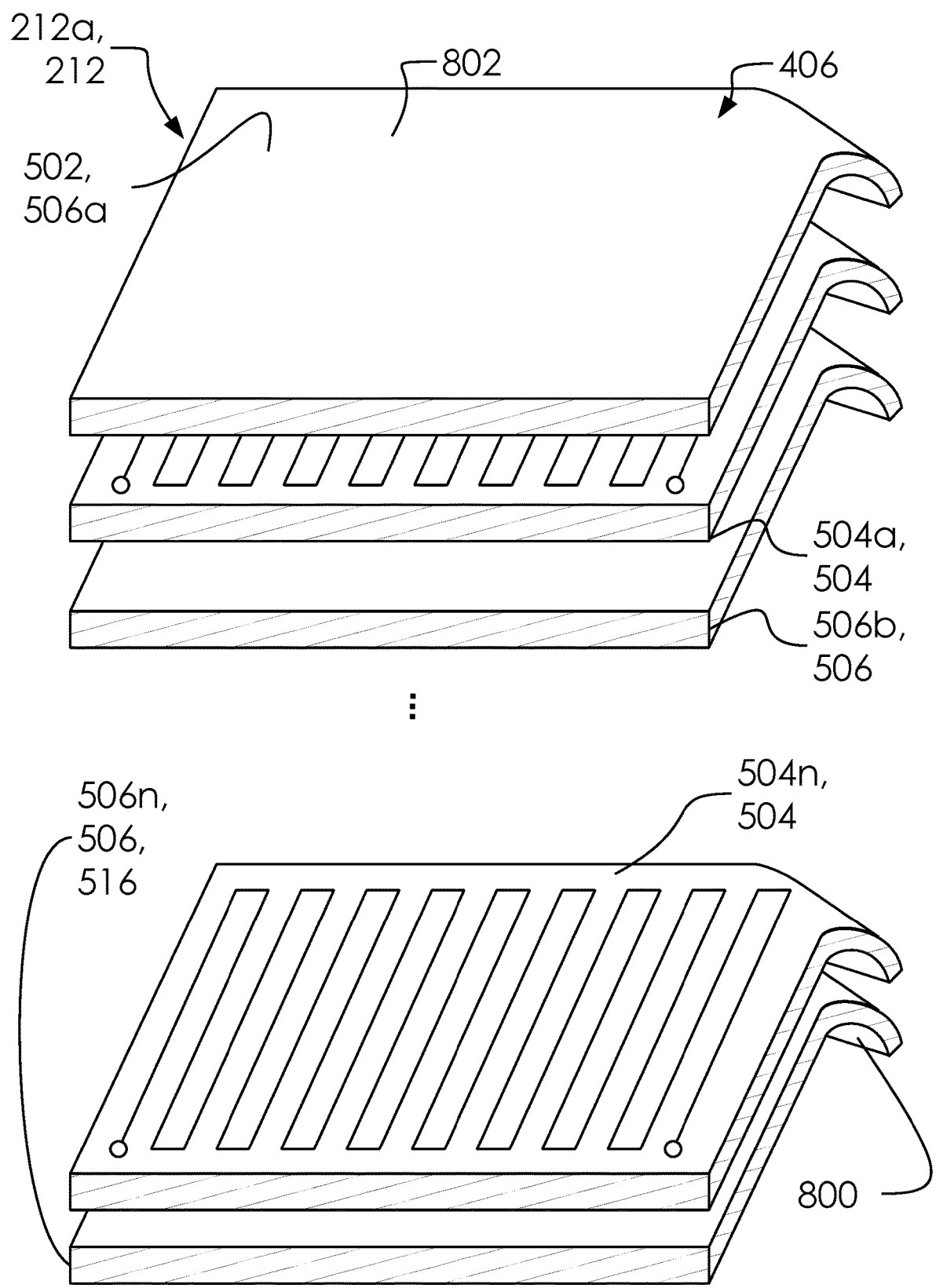

FIG. 8 illustrates a perspective exploded front side view of first panel 212a.

In one embodiment, said one or more panels 212 can comprise said bottom surface 800 and said top surface 802.

In one embodiment, said one or more panels 212 can comprise a flexible material (said flexible circuit card material 406), as illustrated, which can comprise aluminum material.

In one embodiment, said insulator layer n 506n and said detector layer n 504n can comprise a bottom set of said detector and insulator layers, for nomenclature purposes. In one embodiment, said bottom insulator layer 516 can comprise said bottom surface 800. In one embodiment, said bottom surface 800 can be adhered to said exterior surface 410 with adhesive, as is known in the art The following sentences are included for completeness of this disclosure with reference to the claims.

A time domain detection system 100 to measure and report on hypervelocity impacts HVI between an interceptor vehicle 102 and a target vehicle 104. Wherein, said time domain detection system 100 comprises a target vehicle components 200 installed on said target vehicle 104, a one or more panels 212 arranged on a portion of said target vehicle 104 at a potential HVI locations 404, and a hit detection system 208 wired into said one or more panels 212. Said target vehicle components 200 comprise at least said hit detection system 208, and a lines 214. Said one or more panels 212 are wired into said hit detection system 208 with said lines 214. Said hit detection system 208 is configured to communicate with said one or more panels 212 over said lines 214. Said one or more panels 212 can each comprise a one or more detector panel layers 504, and a two or more insulator layers 506. Said two or more insulator layers 506 comprise at least a top insulator layer 502 and a bottom insulator layer 516 of said one or more panels 212. Said one or more detector panel layers 504 comprise at least a first detector panel layer 504a. Said two or more insulator layers 506 comprise at least a first insulator layer 506a and a second insulator layer 506b. Said top insulator layer 502 is arranged over said first detector panel layer 504a. Layers of said one or more panels 212 continue such that each said one or more detector panel layers 504 comprises an insulator below and above itself. The last layer of said one or more panels 212 comprises said bottom insulator layer 516. Each of said one or more detector panel layers 504 comprise at least one of a circuit path 408. Each said circuit path 408 comprise an injection point end 510 and an open circuit end 508. Said injection point end 510 are connected to said hit detection system 208 with one of said lines 214. Said hit detection system 208 is configured to send a pulse 606 through said injection point end 510, said pulse 606 is reflected from said open circuit end 508 and back to said injection point end 510 as a reflected signal 610. Said hit detection system 208 is configured to measure a reflection time 614 between said pulse 606 and said reflected signal 610 and determine if said circuit path 408 is in a nominal or broken condition. Said hit detection system 208 is configured to send a plurality of said pulse 606 and receive a plurality of said reflected signal 610 to increase accuracy of measurement and to return information on progressive damage. Said hit detection system 208 is configured to calculate a missing signal 616 where said reflected signal 610 does not return to said injection point end 510.

Said target vehicle components 200 further comprises a communications system 210 and. Said hit detection system 208 encodes status reports related to said target vehicle 104 and transmits the same using said communications system 210.

Said time domain detection system 100 from claim 1. Said one or more panels 212 are flexible materials being adapted to adhere to nonplanar surfaces.

Said target vehicle 104 comprises a cone shape. Said one or more panels 212 are arranged around an exterior surface 410 of said target vehicle 104.

Said one or more panels 212 are a flat and inflexible circuits suited to flatter portions of an exterior surface 410.

Said lines 214 comprises one line to each of said injection point end 510 for said one or more detector panel layers 504.

A plurality of said circuit path 408 are included on a single among said one or more detector panel layers 504. Accordingly, said one or more detector panel layers 504 is configured to be pierced in a first trace 512a and remain intact on a second trace 512b, where said first trace 512a and said second trace 512b are on the same said one or more detector panel layers 504.

Said circuit path 408 are routed back and forth across portions of said one or more detector panel layers 504 in order to increase a transmission time from said injection point end 510 to said open circuit end 508 and back.

Various changes in the details of the illustrated operational methods are possible without departing from the scope of the following claims. Some embodiments may combine the activities described herein as being separate steps. Similarly, one or more of the described steps may be omitted, depending upon the specific operational environment the method is being implemented in. It is to be understood that the above description is intended to be illustrative, and not restrictive. For example, the above-described embodiments may be used in combination with each other. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A time domain detection system to measure and report on one or more hypervelocity impacts (HVI) between an interceptor vehicle and a target vehicle; wherein,
    said time domain detection system comprises
        a target vehicle components installed on said target vehicle,
        one or more panels arranged on a portion of said target vehicle at potential HVI locations, and
        a hit detection system wired into said one or more panels;
    said target vehicle components comprise at least said hit detection system, and lines;
    said one or more panels are wired into said hit detection system with said lines;
    said hit detection system is configured to communicate with said one or more panels over said lines;
    said one or more panels can each comprise one or more detector panel layers, and two or more insulator layers;
    said two or more insulator layers comprise at least a top insulator layer and a bottom insulator layer of said one or more panels;
    said one or more detector panel layers comprise at least a first detector panel layer;
    said two or more insulator layers comprise at least a first insulator layer and a second insulator layer;
    said top insulator layer is arranged over said first detector panel layer;
    said two or more insulator layers of said one or more panels continue such that each said one or more detector panel layers comprises one insulator layer below and above itself;
    a last layer of said one or more panels comprises said bottom insulator layer;
    each of said one or more detector panel layers comprise at least one circuit path;
    each said at least one circuit path comprise an injection point end and an open circuit end;
    said injection point end, of each said at least one circuit path, are connected to said hit detection system with one of said lines;
    said hit detection system is configured for:
        sending a plurality of pulses in series through said injection point end, each of said plurality of pulses are reflected from said open circuit end and back to said injection point end as a return signal,
        measuring reflection times between each pulse of said plurality of pulses and its corresponding said return signal,
        calculating whether each of said reflection times either remain constant, decrease or comprise a missing signal,
        calculating whether said at least one circuit path is in a nominal condition or a broken condition where each said reflection times decreases between pulses or said return signal does not return,
        continuing to measure for further changes in said reflection times after said broken condition is calculated to increase accuracy of measurement and to return information on progressive damage,
        calculating a current distance between said injection point end and said open circuit end for each pulse of said plurality of pulses, and
        calculating a location of said hypervelocity impacts HVI using said calculation of said current distance between said injection point end and said open circuit end.

2. The time domain detection system from claim 1, wherein:
    said target vehicle components further comprises a communications system; and
    said hit detection system encodes status reports related to said target vehicle and transmits the same using said communications system.

3. The time domain detection system from claim 1, wherein:
    said one or more panels are flexible materials being adapted to adhere to nonplanar surfaces.

4. The time domain detection system from claim 3, wherein:
    said target vehicle comprises a cone shape; and
    said one or more panels are arranged around an exterior surface of said target vehicle.

5. The time domain detection system from claim 1, wherein:
    said one or more panels are flat and inflexible circuits suited to flatter portions of an exterior surface.

6. The time domain detection system from claim 1, wherein:
    said lines comprises one line to each of said injection point end for said one or more detector panel layers.

7. The time domain detection system from claim 1, wherein:
    a plurality of said at least one circuit path are included on a single among said one or more detector panel layers; and
    accordingly, said one or more detector panel layers are configured to be pierced in a first trace and remain intact on a second trace, where said first trace and said second trace are on the same said one or more detector panel layers.

8. The time domain detection system from claim 1, wherein:
said at least one circuit path are routed back and forth across portions of said one or more detector panel layers to increase a transmission time from said injection point end to said open circuit end and back.

9. The time domain detection system from claim 1, wherein:
said one or more panels are flexible materials being adapted to adhere to irregular surfaces.

10. The time domain detection system from claim 1, wherein:
said hit detection system comprises an electronic transceiver configured to measure time to sub-nanosecond levels by using a clock of at least 6 GHz.

11. The time domain detection system from claim 1, wherein:
said plurality of pulses comprise square wave pulses contain wide band frequency energy that result in a wide band return pulse; and
electronics that drive said hit detection system are capable of creating a wave form that matches a reactance of a signal path to minimize of time and frequency distortion.

12. The time domain detection system from claim 1, wherein:
as said reflection time becomes shorter due to damage said hit detection system is configured to increase a pulse repetition rate and send another pulse to increase accuracy.

13. A time domain detection system to measure and report on a one or more hypervelocity impacts (HVI) between an object and a vehicle; wherein,
said time domain detection system comprises lines,
one or more panels arranged on a portion of said vehicle at potential HVI locations, and
a hit detection system wired into said one or more panels;
said one or more panels are wired into said hit detection system with said lines;
said hit detection system is configured to communicate with said one or more panels over said lines;
said one or more panels can each comprise one or more detector panel layers, and two or more insulator layers;
said two or more insulator layers comprise at least a top insulator layer and a bottom insulator layer of said one or more panels;
said one or more detector panel layers comprise at least a first detector panel layer;
said two or more insulator layers comprise at least a first insulator layer and a second insulator layer;
said top insulator layer is arranged over said first detector panel layer;
said two or more insulator layers of said one or more panels continue such that each said one or more detector panel layers comprises an insulator layer below and above itself;
a last layer of said one or more panels comprises said bottom insulator layer;
each of said one or more detector panel layers comprise at least one circuit path;
each said at least one circuit path comprise an injection point end and an open circuit end;
said injection point end, of each said at least one circuit path, are connected to said hit detection system with one of said lines;
said hit detection system is configured for:
sending a plurality of pulses in series through said injection point end, each of said plurality of pulses are reflected from said open circuit end and back to said injection point end as a return signal,
measuring reflection times between each pulse of said plurality of pulses and its corresponding said return signal,
calculating whether each of said reflection times either remain constant, decrease or comprise a missing signal,
calculating whether said circuit path is in a nominal condition or a broken condition where each said reflection times decreases between pulses or said return signal does not return,
continuing to measure for further changes in said reflection times after said broken condition is calculated to increase accuracy of measurement and to return information on progressive damage,
calculating a current distance between said injection point end and said open circuit end for each of said plurality of pulses, and
calculating a location of said hypervelocity impacts HVI using said calculation of said current distance between said injection point end and said open circuit end.

14. The time domain detection system from claim 13, wherein:
said hit detection system comprises an electronic transceiver configured to measure time to sub-nanosecond levels by using a clock of at least 6 GHz.

15. The time domain detection system from claim 13, wherein:
said plurality of pulses comprise square wave pulses contain wide band frequency energy that result in a wide band return pulse; and
electronics that drive said hit detection system are capable of creating a wave form that matches a reactance of a signal path to minimize of time and frequency distortion.

* * * * *